(12) United States Patent
Takamoto et al.

(10) Patent No.: US 10,014,235 B2
(45) Date of Patent: Jul. 3, 2018

(54) UNDERFILL MATERIAL, LAMINATED SHEET AND METHOD FOR PRODUCING SEMICONDUCTOR DEVICE

(71) Applicant: NITTO DENKO CORPORATION, Ibaraki-shi, Osaka (JP)

(72) Inventors: Naohide Takamoto, Ibaraki (JP); Hiroyuki Hanazono, Ibaraki (JP); Akihiro Fukui, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/124,002

(22) PCT Filed: Feb. 20, 2015

(86) PCT No.: PCT/JP2015/054805
§ 371 (c)(1),
(2) Date: Sep. 6, 2016

(87) PCT Pub. No.: WO2015/133297
PCT Pub. Date: Sep. 11, 2015

(65) Prior Publication Data
US 2017/0018472 A1    Jan. 19, 2017

(30) Foreign Application Priority Data

Mar. 7, 2014   (JP) .................. 2014-045119

(51) Int. Cl.
*H01L 23/29* (2006.01)
*H01L 21/56* (2006.01)
(Continued)

(52) U.S. Cl.
CPC .............. *H01L 23/29* (2013.01); *C09J 7/24* (2018.01); *H01L 21/563* (2013.01); *H01L 21/568* (2013.01); *H01L 21/6835* (2013.01); *H01L 21/6836* (2013.01); *H01L 23/293* (2013.01); *H01L 24/27* (2013.01); *H01L 24/29* (2013.01); *H01L 24/73* (2013.01); *H01L 24/81* (2013.01); *H01L 24/83* (2013.01); *H01L 24/92* (2013.01); *H01L 25/0657* (2013.01); *H01L 25/50* (2013.01); *C09J 2203/326* (2013.01); *C09J 2433/006* (2013.01); *H01L 24/05* (2013.01); *H01L 24/13* (2013.01); *H01L 24/14* (2013.01); *H01L 24/16* (2013.01); *H01L 24/32* (2013.01); *H01L 24/33* (2013.01); *H01L 2221/6834* (2013.01); *H01L 2221/68327* (2013.01); *H01L 2221/68336* (2013.01); *H01L 2221/68377* (2013.01); *H01L 2221/68381* (2013.01); *H01L 2224/05155* (2013.01); *H01L 2224/05644* (2013.01); *H01L 2224/13025* (2013.01); *H01L 2224/13082* (2013.01); *H01L 2224/13111* (2013.01); *H01L 2224/13144* (2013.01); *H01L 2224/13147* (2013.01); *H01L 2224/14181* (2013.01); *H01L 2224/16145* (2013.01); *H01L 2224/16227* (2013.01); *H01L 2224/16245* (2013.01); *H01L 2224/271* (2013.01); *H01L 2224/27002* (2013.01); *H01L 2224/27003* (2013.01); *H01L 2224/27436* (2013.01); *H01L 2224/293* (2013.01); *H01L 2224/2919* (2013.01); *H01L 2224/2929* (2013.01); *H01L 2224/29291* (2013.01); *H01L 2224/29311* (2013.01); *H01L 2224/29316* (2013.01);
(Continued)

(58) Field of Classification Search
CPC .... H01L 21/568; H01L 23/293; C09J 133/08; C09J 163/00; C09J 2433/006
USPC ........................................ 257/778; 525/109
See application file for complete search history.

(56) References Cited

U.S. PATENT DOCUMENTS

2002/0001688 A1   1/2002  Ueda et al.
2011/0241228 A1*  10/2011 Enomoto ........... C08G 59/4071
                                                  257/793
(Continued)

FOREIGN PATENT DOCUMENTS

JP    2005264109 A    9/2005
JP    2005307169 A   11/2005
(Continued)

OTHER PUBLICATIONS

ISA Japan Patent Office, International Search Report Issued in Application No. PCT/JP2015/054805, dated May 19, 2015, WIPO, 3 pages.
(Continued)

*Primary Examiner* — Fred M Teskin
(74) *Attorney, Agent, or Firm* — Alleman Hall Creasman & Tuttle LLP

(57) ABSTRACT

An underfill material having sufficient curing reactivity, and capable of achieving a small change in viscosity and good electrical connection even when loaded with thermal history, a laminated sheet including the underfill material, and a method for manufacturing a semiconductor device. The underfill material has a melt viscosity at 150° C. before heating treatment of 50 Pa·s or more and 3,000 Pa·s or less, a viscosity change rate of 500% or less, at 150° C. as a result of the heating treatment, and a reaction rate represented by $\{(Q_t-Q_h)/Q_t\}\times 100\%$ of 90% or more, where $Q_t$ is a total calorific value in a process of temperature rise from $-50°$ C. to $300°$ C. and $Q_h$ is a total calorific value in a process of temperature rise from $-50°$ C. to $300°$ C. after heating at $175°$ C. for 2 hours in a DSC measurement.

5 Claims, 2 Drawing Sheets

(51) Int. Cl.
*H01L 21/683* (2006.01)
*H01L 25/065* (2006.01)
*C09J 7/00* (2018.01)
*H01L 25/00* (2006.01)
*C09J 7/24* (2018.01)
*C08L 63/00* (2006.01)
*C08L 101/12* (2006.01)
*H01L 23/00* (2006.01)

(52) U.S. Cl.
CPC ........... *H01L 2224/29318* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29371* (2013.01); *H01L 2224/29387* (2013.01); *H01L 2224/29393* (2013.01); *H01L 2224/32145* (2013.01); *H01L 2224/32225* (2013.01); *H01L 2224/32227* (2013.01); *H01L 2224/32245* (2013.01); *H01L 2224/33181* (2013.01); *H01L 2224/73104* (2013.01); *H01L 2224/73204* (2013.01); *H01L 2224/81127* (2013.01); *H01L 2224/81191* (2013.01); *H01L 2224/81193* (2013.01); *H01L 2224/81203* (2013.01); *H01L 2224/81204* (2013.01); *H01L 2224/81815* (2013.01); *H01L 2224/81907* (2013.01); *H01L 2224/83127* (2013.01); *H01L 2224/83191* (2013.01); *H01L 2224/83203* (2013.01); *H01L 2224/83204* (2013.01); *H01L 2224/83862* (2013.01); *H01L 2224/83907* (2013.01); *H01L 2224/92* (2013.01); *H01L 2224/9211* (2013.01); *H01L 2224/94* (2013.01); *H01L 2225/06513* (2013.01); *H01L 2225/06517* (2013.01); *H01L 2225/06541* (2013.01); *H01L 2225/06565* (2013.01); *H01L 2924/0635* (2013.01); *H01L 2924/3512* (2013.01)

(56) References Cited

U.S. PATENT DOCUMENTS

2011/0256669 A1* 10/2011 Takamoto ........... H01L 21/6836
 438/118
2012/0018902 A1* 1/2012 Takamoto ............. C09J 163/00
 257/778
2013/0137218 A1 5/2013 Morita et al.

FOREIGN PATENT DOCUMENTS

JP 4438973 B2 3/2010
JP 2013187242 A 9/2013

OTHER PUBLICATIONS

International Bureau of WIPO, International Preliminary Report on Patentability Issued in Application No. PCT/JP2015/054805, dated Sep. 22, 2016, WIPO, 5 pages.

* cited by examiner

UNDERFILL MATERIAL, LAMINATED SHEET AND METHOD FOR PRODUCING SEMICONDUCTOR DEVICE

TECHNICAL FIELD

The present invention relates to an underfill material, a laminated sheet and a method for producing a semiconductor device.

BACKGROUND ART

In recent years, thinner and smaller semiconductor devices and their packages are increasingly desired. For that purpose, a flip-chip type semiconductor device has been broadly used, in which a semiconductor element such as a semiconductor chip is mounted on a substrate by flip-chip bonding (flip-chip bonded to a substrate). The flip-chip bonding is a mounting method of fixing the semiconductor chip to an adherend through bump electrodes formed on the circuit surface of the semiconductor chip so that the circuit surface faces the electrode formation surface of the adherend (face down). In the flip-chip mounting of the semiconductor element to the adherend, solder bumps, etc. provided on the semiconductor element are melted to electrically connect the two together.

After surface mounting, a sealing resin is filled in a space between a semiconductor element and a substrate for ensuring protection of the surface of the semiconductor element and connection reliability between the semiconductor element and the substrate. As this sealing resin, a liquid sealing resin (an underfill material) is widely used, but it is difficult to adjust an injection position and an injection amount with the liquid sealing resin. Thus, there has been proposed a technique of filling a space between a semiconductor element and a substrate using a sheet-like sealing resin (Patent Document 1).

PRIOR ART DOCUMENTS

Patent Documents

Patent Document 1: JP-B1-4438973

SUMMARY OF THE INVENTION

Problems to be Solved by the Invention

By the above-described technique, the space between the semiconductor element and the adherend is filled to give good connection reliability. However, in a chip-on-wafer (CoW) process and a through silicon via (TSV) lamination process that are examples of a semiconductor device manufacturing process, in order to improve process efficiency, there has been recommended a procedure of temporarily fixing a large number of semiconductor chips with an underfill material onto an adherend (a semiconductor wafer or a semiconductor chip) by flip-chip bonding, and finally heating the resultant to collectively bond the laminate. In this case, a difference in thermal history occurs between the semiconductor chips bonded in the initial stage of the process and the semiconductor chips bonded in the final stage of the process. Accordingly, the viscosity of the underfill material of the semiconductor chips bonded in the initial stage drastically changes due to the influence of the thermal history. As a result, the semiconductor chip may not be electrically connected to the adherend because cracks are generated in the connection members such as a bump when the semiconductor chips are collectively bonded, or the connection members cannot be bonded to each other.

As a countermeasure, it is conceivable to decrease the reactivity of the underfill material in order to reduce the influence of thermal history. However, a long period of time or a high temperature is required to sufficiently progress the curing reaction if the reactivity is decreased excessively, and the process efficiency may not be improved.

The present invention has been made in consideration of the above-described problems, and an object thereof is to provide an underfill material having sufficient curing reactivity, and capable of achieving a small change in viscosity and good electrical connection even when loaded under conditions of differing thermal history; a laminated sheet including the underfill material; and a method for manufacturing a semiconductor device.

Means for Solving the Problems

As a result of an extensive investigation, the present inventors found that the above-described problems can be solved by adopting the following configuration, and completed the present invention.

That is, the present invention provides an underfill material, wherein a melt viscosity at 150° C. before heating treatment is 50 Pa·s or more and 3,000 Pa·s or less, a viscosity change rate represented by $(\eta 2/\eta 1) \times 100$ % is 500% or less, where $\eta 1$ is the melt viscosity at 150° C. before heating treatment and $\eta 2$ is the melt viscosity at 150° C. after heating treatment at 130° C. for 1 hour, and a reaction rate represented by $\{(Qt-Qh)/Qt\} \times 100$ % is 90% or more, where Qt is the total calorific value in a process of temperature rise from −50° C. to 300° C. and Qh is the total calorific value in a process of temperature rise from −50° C. to 300° C. after heating at 175° C. for 2 hours in a DSC measurement.

The melt viscosity of the underfill material at 150° C. before heating treatment (hereinafter sometimes simply referred to as "melt viscosity") is 50 Pa·s or more and 3,000 Pa·s or less. By adopting the lower limit, protrusion of the underfill material from a semiconductor chip can be prevented. Meanwhile, by adopting the upper limit, entering of the connection members into the underfill material becomes easy, and the reliability of the electrical connection can be improved. If the melt viscosity is less than the lower limit, the amount of the protruded underfill material is large, and the peripheral elements may be polluted. If the melt viscosity exceeds the upper limit, entering of the connection members into the underfill material is insufficient, and the electrical connection may not be attained.

Because the viscosity change rate of the underfill material at 150° C. before and after heating treatment at 130° C. (hereinafter sometimes simply referred to as "viscosity change rate") is 500% or less, an excessive increase of the viscosity after heating treatment can be suppressed, and good electrical connection can be achieved even with a process in which thermal history differs inevitably. If the viscosity change rate exceeds 500%, the stress generated in the connection members such as a bump and a pad may cause cracks in the connection members or prevention of the contact between connection members, and the electrical connection may not be attained.

The reaction rate of the underfill material represented by $\{(Qt-Qh)/Qt\} \times 100$ %, where Qt is the total calorific value in a process of temperature rise from −50° C. to 300° C. and Qh is the total calorific value in a process of temperature rise from −50° C. to 300° C. after heating at 175° C. for 2 hours in a DSC measurement (hereinafter sometimes simply referred to as "reaction rate"), is 90% or more. In other words, the degree of progress in the curing reaction of the underfill material when thermally cured at 175° C. for 2 hours is 90% or more. Although an increase of the viscosity of the underfill material after heating is suppressed as described above, 90% or more of the curing reaction of the underfill material progresses after the underfill material is heated at 175° C. for 2 hours. Therefore, it is not necessary to perform the curing treatment at high temperature or for a long period of time, and this can contribute to efficiency of the semiconductor device manufacturing process. If the reaction rate is less than 90%, the heating treatment has to be performed at a higher temperature or for a longer period of time to cure the underfill material, compared to the conventional heating treatment, resulting in a decrease of the process efficiency. In addition, the degree of progress in the curing reaction when curing the underfill material easily becomes insufficient, and moisture and heat resistance reliability may deteriorate.

The underfill material preferably contains a latent curing accelerator. Accordingly, both the suppression of the increase of the viscosity due to the thermal history of the underfill material and the curing reactivity can be achieved at a high level.

The underfill material preferably contains an acrylic resin, and 1 part by weight to 2 parts by weight of the latent curing accelerator relative to 100 parts by weight of the acrylic resin.

If the underfill material contains an acrylic resin, moderate flexibility can be given to the underfill material, and thus the workability improves. If the content of the latent curing accelerator relative to the acrylic resin is set within a predetermined range, an unnecessary increase of the viscosity and the curing reaction are suppressed, and good electrical connection can be achieved.

The present invention also includes a laminated sheet including a pressure-sensitive adhesive tape having a base material, and a pressure-sensitive adhesive layer provided on the base material, and the underfill material laminated on the pressure-sensitive adhesive layer.

The underfill material and the pressure-sensitive adhesive tape are integrally used to improve the efficiency of the manufacturing process from processing of a semiconductor wafer to mounting of a semiconductor element.

The pressure-sensitive adhesive tape maybe either of a tape for grinding the backside of a semiconductor wafer, or a dicing tape.

The present invention also includes a method for manufacturing a semiconductor device including an adherend, a semiconductor element electrically connected to the adherend, and an underfill material filling a space between the adherend and the semiconductor element, including: a step of preparing a semiconductor element with an underfill material in which the underfill material is bonded to the semiconductor element, and a connecting step of electrically connecting the semiconductor element with the adherend while filling the space between the adherend and the semiconductor element with the underfill material.

Because an underfill material having a specific viscosity change rate, a specific melt viscosity, and a specific reaction rate is used in the manufacturing method, an increase of the viscosity of the underfill material is suppressed, to obtain good electrical connection between the semiconductor element and the adherend even when a plurality of semiconductor elements are mounted or laminated on the adherend, such that the underfill material is loaded with thermal history. Because the underfill material has moderate curing reactivity, the process efficiency can be improved.

MODE FOR CARRYING OUT THE INVENTION

The present invention will be described in detail with reference to embodiments described below; however, the present invention is not limited to these embodiments. In a part or the entirety of the drawings, parts that are unnecessary for the explanation are omitted, and there are parts that are enlarged or shrunk to make the explanation easy.

<First Embodiment<

The first embodiment of the present invention is described with reference to a laminated sheet including a dicing tape, and a predetermined underfill material laminated on the dicing tape, and a method for manufacturing a semiconductor device using the laminated sheet. Thus, in the present embodiment, a dicing tape is used as a pressure-sensitive adhesive tape. The following explanation is basically applicable to a case in which an underfill material is used alone.

In the present embodiment, a semiconductor wafer having a circuit on both surfaces is used to manufacture a semiconductor device. Further, dicing is performed on the dicing tape, and pickup of a semiconductor element is performed to finally mount the semiconductor element onto an adherend.

As typical steps, the method of the present embodiment includes a preparation step of preparing the laminated sheet, a bonding step of bonding a semiconductor wafer having a circuit surface having connection members on both surfaces to an underfill material of the laminated sheet, a dicing step of dicing the semiconductor wafer to form a semiconductor element with the underfill material, a pickup step of peeling the semiconductor element with the underfill material from the laminated sheet, a position alignment step of aligning the relative position between the semiconductor element and the adherend to their planned connection position, and a connection step of electrically connecting the semiconductor element with the adherend through the connection members while filling the space between the adherend and the semiconductor element with the underfill material.

[Preparation Step]

(Laminated Sheet)

Figure 1A:
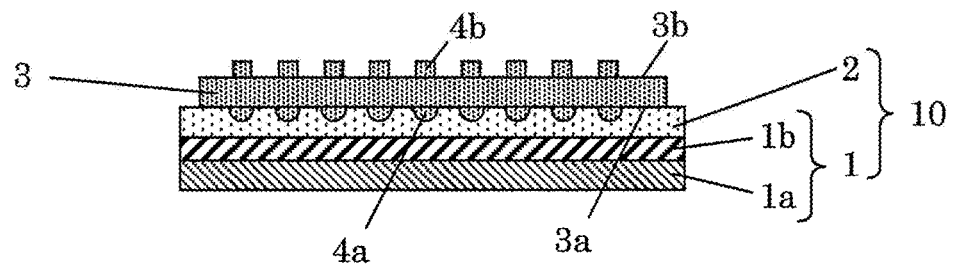
FIG. 1A is a sectional schematic view showing a step for producing a semiconductor device according to one embodiment of the present invention.

In the preparation step, a laminated sheet 10 including a dicing tape 1 and a predetermined underfill material 2 laminated on the dicing tape 1 is prepared (refer to FIG. 1A).

(Dicing Tape)

The dicing tape 1 includes a base material 1a, and a pressure-sensitive adhesive layer 1b laminated on the base material 1a. As shown in FIG. 1A, the underfill material 2 should be provided to have a size that is sufficient for bonding with a semiconductor wafer 3, and may be laminated on the entire surface of the dicing tape 1.

(Base Material)

The base material 1a is a reinforcement matrix for the laminated sheet 10. Examples include polyolefins such as low-density polyethylene, linear polyethylene, medium-density polyethylene, high-density polyethylene, very low-density polyethylene, random copolymerized polypropylene, block copolymerized polypropylene, homo polypropylene, polybutene and polymethylpentene, an ethylene-vinyl acetate copolymer, an ionomer resin, an ethylene-(meth)acrylic acid copolymer, an ethylene-(meth)acrylate (random, alternating) copolymer, an ethylene-butene copolymer, an ethylene-hexene copolymer, polyurethane, polyesters such as polyethylene terephthalate and polyethylene naphthalate, polycarbonate, polyimide, polyether ether ketone, polyimide, polyetherimide, polyamide, total aromatic polyamide, polyphenyl sulfide, alamid (paper), glass, glass cloth, a fluororesin, polyvinyl chloride, polyvinylidene chloride, a cellulose-based resin, a silicone resin, a metal (foil), and papers such as glassine paper. When the pressure-sensitive adhesive layer 1b is of an ultraviolet-ray curing type, the base material 1a is preferably one having a permeability to ultraviolet rays.

In addition, examples of the material of the base material 1a include polymers such as crosslinked products of the resins described above. For the plastic film described above, an unstretched film may be used, or a film subjected to uniaxial or biaxial stretching may be used as necessary.

The surface of the base material 1a can be subjected to a common surface treatment, for example, a chemical or physical treatment such as a chromic acid treatment, ozone exposure, flame exposure, high-voltage electrical shock exposure or an ionized radiation treatment, or a coating treatment with a primer (e.g. adhesive substance to be described) for improving adhesion with an adjacent layer, the retention property and so on.

For the base material 1a, the same material or different materials can be appropriately selected and used, and one obtained by blending several materials can be used as necessary. The base material 1a can be provided thereon with a vapor-deposited layer of an electrically conductive substance made of a metal, an alloy, an oxide thereof, or the like and having a thickness of about 30 to 500 Å for imparting an antistatic property. It is also possible to impart an antistatic property to the base material by addition of an antistatic agent. The base material 1a may be a single layer or a multiple layer having two or more layers.

The thickness of the base material 1a is not particularly limited, and can be appropriately determined, but is generally about 5 to 200 μm, and is preferably 35 to 120 μm.

The base material 1a may contain various kinds of additives (e.g. colorant, filler, plasticizer, antiaging agent, antioxidant, surfactant, flame retardant, etc.) within the bounds of not impairing the effect of the present invention.

(Pressure-sensitive Adhesive Layer)

A pressure-sensitive adhesive used for forming the pressure-sensitive adhesive layer 1b is not particularly limited as long as it can tightly hold a semiconductor wafer through an underfill material at the time of dicing, and provide control so that the semiconductor element with the underfill material can be peeled off during pickup. For example, a general pressure-sensitive adhesive such as an acryl-based pressure-sensitive adhesive or a rubber-based pressure-sensitive adhesive can be used. As the pressure-sensitive adhesive, an acryl-based pressure-sensitive adhesive having an acryl-based polymer as a base polymer is preferable from the viewpoint of ease of cleaning of an electronic component sensitive to contamination, such as a semiconductor wafer or glass, using ultrapure water or an organic solvent such as an alcohol.

Examples of the acryl-based polymer include those using an acrylate as a main monomer component. Examples of the acrylate include one or more of (meth) acrylic acid alkyl esters (for example, linear or branched alkyl esters with the alkyl group having 1 to 30, particularly 4 to 18 carbon atoms, such as methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethylhexyl ester, isooctyl ester, nony ester, decyl ester, isodecyl ester, undecyl ester, dodecyl ester, tridecyl ester, tetradecyl ester, hexadecyl ester, octadecyl ester and eicosyl ester) and (meth)acrylic acid cycloalkyl esters (for example, cyclopentyl ester and cyclohexyl ester, etc.). The (meth)acrylic acid ester refers to an acrylic acid ester and/or a methacrylic acid ester, and (meth) has the same meaning throughout the present invention.

The acryl-based polymer may contain a unit corresponding to any other monomer component capable of being copolymerized with the (meth) acrylic acid alkyl ester or cycloalkyl ester as necessary for the purpose of modifying cohesive strength, heat resistance and so on. Examples of the monomer component include carboxyl group-containing monomers such as acrylic acid, methacrylic acid, carboxyethyl (meth)acrylate, carboxypentyl (meth) acrylate, itaconic acid, maleic acid, fumaric acid and crotonic acid; acid anhydride monomers such as maleic anhydride and itaconic anhydride; hydroxyl croup-containing monomers such as 2-hydroxyethyl (meth) acrylate, 2-hydroxypropyl (meth) acrylate, 4-hydroxybutyl (meth) acrylate, 6-hydroxyhexyl (meth) acrylate, 8-hydroxyoctyl (meth) acrylate, 10-hydroxydecyl (meth)acrylate, 12-hydroxylauryl (meth) acrylate and (4-hydroxymethylcyclohexyl)-methyl (meth) acrylate; sulfonic acid group-containing monomers such as styrenesulfonic acid, allylsulfonic acid, 2-(meth)acrvlamide-2-methylpropanesulfonic acid, (meth) acrylamidepropanesulfonic acid, sulfopropyl (meth)acrylate and (meth) acryloyloxynaphthalenesulfonic acid; phosphoric acid group-containing monomers such as 2-hydroxyethylacryloyl phosphate; and acrylamide and acrylonitrile. One or more of these monomers capable of being copolymerized can be used. The used amount of the monomer component capable of copolymerization is preferably 40% by weight or less based on total monomer components.

Further, the acry -based polymer may contain a polyfunctional monomer or the like as a monomer component for copolymerization as necessary for the purpose of crosslinking. Examples of the polyfunctional monomer include hexanediol di(meth)acrylate, (poly)ethylene glycol di(meth) acrylate, (poly) propylene glycol di(meth)acrylate, neopentylglycol di(meth)acrylate, pentaerythrithol di(meth)acrylate, trimethylolpropane tri(meth)acrylate, pentaerythrithol tri(meth)acrylate, dipentaerythrithol hexa(meth)acrylate, epoxy (meth) acrylate, polyester (meth)acrylate and urethane (meth) acrylate. One or more of these polyfunctional monomers can be used. The used amount of the polyfunctional monomer is preferably 30% by weight or less based on total monomer components from the viewpoint of an adhesion property.

The acryl-based polymer is obtained by subjecting a single monomer or monomer mixture of two or more kinds of monomers to polymerization. Polymerization can be carried out by any method such as solution polymerization, emulsion polymerization, bulk polymerization or suspension polymerization. The content of low-molecular weight substances is preferably low from the viewpoint of prevention of contamination of a clean adherend. In this respect, the number average molecular weight of the acryl-based polymer is preferably 300,000 or more, further preferably about 400,000 to 3,000,000.

For the pressure-sensitive adhesive, an external crosslinker can also be appropriately employed for increasing the number average molecular weight of an acryl-based polymer or the like as a base polymer. Specific examples of the external crosslinking methods include a method in which so called a crosslinker such as a polyisocyanate compound, an epoxy compound, an aziridine compound or a melamine-based crosslinker is added and reacted. When an external crosslinker is used, the used amount thereof is appropriately determined according to a balance with a base polymer to be crosslinked, and further a use application as a pressure-sensitive adhesive. Generally, the external crosslinker is blended in an amount of preferably about 5 parts by weight or less, further preferably 0.1 to 5 parts by weight, based on 100 parts by weight of the base polymer. Further, for the pressure-sensitive adhesive, previously known various kinds of additives, such as a tackifier and an anti-aging agent, may be used as necessary in addition to the aforementioned components.

The pressure-sensitive adhesive layer $1b$ can be formed by radiation curing-type pressure-sensitive adhesive. By irradiating the radiation curing-type pressure-sensitive adhesive with radiations such as ultraviolet rays, the degree of crosslinking thereof can be increased to easily reduce its adhesive power, so that peeling of the semiconductor chip with the underfill material can be easily performed. Examples of radiations include X-rays, ultraviolet rays, electron rays, $\alpha$ rays, $\beta$ rays and neutron rays.

For the radiation curing-type pressure-sensitive adhesive, one having a radiation-curable functional group such as a carbon-carbon double bond and showing adherability can be used without Particular limitation. Examples of the radiation curing-type pressure-sensitive adhesive may include, for example an addition-type radiation-curable pressure-sensitive adhesive obtained by blending a radiation-curable monomer component or an oligomer component with a general pressure-sensitive adhesive such as the above-mentioned acryl-based pressure-sensitive adhesive or rubber-based pressure-sensitive adhesive.

Examples of the radiation curable monomer component to be blended include urethane oligomer, urethane (meth)acrylate, trimethylolpropane tri(meth)acrylate, tetramethylolmethane tetra(meth)acrylate, pentaerythrithol tri(meth)acrylate, pentaerythrithol tetra(meth)acrylate, dipentaerythrithol monohydroxypenta(meth)acrylate, dipentaerythrithol hexa(meth)acrylate and 1,4-butanediol di(meth)acrylate. Examples of the radiation curable oligomer component include various oligomers such as urethane-based, polyether-based, polyester-based, polycarbonate-based and polybutadiene-based oligomers, and the appropriate weight-average molecular weight thereof is in a range of about 100 to 30,000. For the blending amount of the radiation curable monomer component or oligomer component, an amount allowing the adhesive strength of the pressure-sensitive adhesive layer to be reduced can be appropriately determined according to the type of the pressure-sensitive adhesive layer. Generally, the blending amount is, for example, 5 to 500 parts by weight, preferably about 40 to 150 parts by weight, based on 100 parts by weight of a base polymer such as an acryl-based polymer forming the pressure-sensitive adhesive.

Examples of the radiation curing-type pressure-sensitive adhesive include, besides the addition-type radiation curing-type pressure-sensitive adhesive described previously, an intrinsic radiation curing-type pressure-sensitive adhesive using, as a base polymer, a polymer having a carbon-carbon double bond in the polymer side chain or main chain or at the end of the main chain. The intrinsic radiation curing-type pressure-sensitive adhesive is preferable because it is not required to contain, or mostly does not contain an oligomer component or the like which is a low-molecular component, and therefore the oligomer component or the like does not migrate in the pressure-sensitive adhesive over time, so that a pressure-sensitive adhesive layer having a stable layer structure can be formed.

For the base polymer having a carbon-carbon double bond, one having a carbon-carbon double bond and also an adherability can be used without no particular limitation. Such a base polymer is preferably one having an acryl-based polymer as a basic backbone. Examples of the basic backbone of the acryl-based polymer include the acryl-based polymers described previously as an example.

The method for introducing a carbon-carbon double bond into the acryl-based polymer is not particularly limited, and various methods can be employed, but it is easy in molecular design to introduce the carbon-carbon double bond into a polymer side chain. Mention is made to, for example, a method in which a monomer having a functional group is copolymerized into an acryl-based polymer beforehand, and thereafter a compound having a functional group that can react with the above-mentioned functional group, and a carbon-carbon double bond is subjected to a condensation or addition reaction while maintaining the radiation curability of the carbon-carbon double bond.

Examples of the combination of these functional groups include a combination of a carboxyl group and an epoxy group, a combination of a carboxyl group and an aziridyl group and a combination of a hydroxyl group and an isocyanate group. Among these combinations of functional groups, the combination of a hydroxyl group and an isocyanate group is suitable in terms of ease of reaction tracing. The functional group may be present at the side of any of the acryl-based polymer and the aforementioned compound as long as the combination of the functional groups is such a combination that the acryl-based polymer having a carbon-carbon double bond is generated, but for the preferable combination, it is preferred that the acryl-based polymer have a hydroxyl group and the aforementioned compound have an isocyanate group. In this case, examples of the isocyanate compound having a carbon-carbon double bond include metacryloyl isocyanate, 2-metacryloyloxyethyl isocyanate, m-isopropenyl-$\alpha,\alpha$-dimethylbenzyl isocyanate. As the acryl-based polymer, one obtained by copolymerizing the hydroxy group-containing monomers described previously as an example, ether-based compounds such as 2-hydroxyethyl vinyl ether, 4-hydroxybutyl vinyl ether and diethylene glycol monovinyl ether, and so on is used.

For the intrinsic radiation curing-type pressure-sensitive adhesive, the base polymer (particularly acryl-based polymer) having a carbon-carbon double bond can be used alone, but the radiation curable monomer component or oligomer component within the bounds of not deteriorating properties can also be blended. The amount of the radiation curable oligomer component or the like is normally within a range of 30 parts by weight or less, preferably in a range of 0 to 10 parts by weight, based on 100 parts by weight of the base polymer.

A photopolymerization initiator is preferably included in the radiation curing-type pressure-sensitive adhesive when it is cured by ultraviolet rays or the like. Examples of the photopolymerization initiator include α-ketol-based compounds such as 4-(2-hydroxyethoxy)phenyl(2-hydroxy-2-propyl)ketone, α-hydroxy-α, α'-dimethylacetophenone, 2-methyl-2-hydroxypropiophenone and 1-hydroxycyclohexyl phenyl ketone; acetophenone-based compounds such as methoxyacetophenone, 2,2-dimethoxy-2-phenylacetophenone, 2,2-diethoxyacetophenone, and 2-methyl-1-[4-(methylthio)-phenyl]-2-morphorinopropane-1; benzoin ether-based compounds such as benzoin ethyl ether, benzoin isopropyl ether and anisoin methyl ether; ketal-based compounds such as benzyldimethylketal; aromatic sulfonyl chloride-based compounds such as 2-naphthalenesulfonyl chloride; photoactive oxime-based compounds such as 1-phenyl-1,2-propanedione-2-(O-ethoxycarbonyl)oxime; benzophenone-based compounds such as benzophenone, benzoyl benzoic acid and 3,3'-dimethyl-4-methoxybenzophenone; thioxanthone-based compounds such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone and 2,4-diisopropylthioxanthone; camphorquinone; halogenated ketone; acylphosphinoxide; and acylphosphonate. The blending amount of the photopolymerization initiator is, for example, about 0.05 to 20 parts by weight based on 100 parts by weight of the base polymer such as an acryl-based Polymer which forms a pressure-sensitive adhesive.

When curing hindrance by oxygen occurs at the time of the irradiation, it is desirable to block oxygen (air) from the surface of the radiation curing-type pressure-sensitive adhesive layer $1b$ by some method. Examples include a method in which the surface of the pressure-sensitive adhesive layer $1b$ is covered with a separator, and a method in which irradiation of ultraviolet rays or the like is carried out in a nitrogen gas atmosphere.

The pressure-sensitive adhesive layer $1b$ may contain various kinds of additives (e.g. colorant, thickener, bulking agent, filler, tackifier, plasticizer, antiaging agent, antioxidant, surfactant, crosslinker, etc.).

The thickness of the pressure-sensitive adhesive layer $1b$ is not particularly limited, but is preferably 1 to 50 µm from the viewpoint of: prevention of chipping in a ground surface of the semiconductor wafer; and compatibility of fixation and retention of an underfill material 2, and so on. The thickness is preferably 5 to 40 µm, more preferably 10 to 30 µm.

(Underfill Material)

An underfill material 2 in this embodiment can be used as a film for sealing, which fills a space between a surface-mounted (for example, flip-chip mounted, or the like.) semiconductor element and an adherend.

The melt viscosity of the underfill material 2 at 150° C. before a heating treatment is 50 Pa·s or more and 3,000 Pa·s or less. The melt viscosity is preferably 75 Pa·s or more and 2,000 Pa·s or less, and more preferably 100 Pa·s or more and 1,000 Pa·s or less. By adopting the lower limit, protrusion of the underfill material from a semiconductor chip can be prevented. Meanwhile, by adopting the upper limit, entering of the connection members into the underfill material becomes easy, and the reliability of electrical connection can be improved.

The viscosity change rate of the underfill material 2 at 150° C. before and after heating treatment is 500% or less. The viscosity chancre rate is preferably 400% or less, and more preferably 300% or less. The lower limit of the viscosity change rate is preferably 100%. However, the viscosity change rate may be 150% or more in consideration of the curing property of the underfill material. By making the viscosity change rate be within the above-described range, an excessive increase of the viscosity after heating treatment can be suppressed, and good electrical connection can be achieved even when the underfill material is subjected to thermal history.

The reaction rate of the underfill material 2 represented by $\{(Qt-Qh)/Qt\}\times 100$ %, where Qt is the total calorific value in a process of temperature rise from −50° C. to 300° C. and Qh is the total calorific value in a process of temperature rise from −50° C. to 300° C. after heating at 175° C. for 2 hours in a DSC measurement, is 90% or more. The reaction rate has only to be 90% or more; however, it is preferably 92% or more, and more preferably 95% or more. Because an increase of the viscosity of the underfill material after heating is suppressed, and 90% or more of the curing reaction of the underfill material progresses after the underfill material is heated at 175° C. for 2 hours, it is not necessary to perform the curing treatment at high temperature or for a long period of time, and this can contribute to efficiency of the semiconductor device manufacturing process. In addition, the curing reaction of the underfill material can be progressed sufficiently, and the moisture and heat resistance reliability can be improved.

Examples of the constituting material of the underfill material include a resin component, a latent curing accelerator, a crosslinker, an organic component such as other organic additives (excluding a solvent), an inorganic filler, and an inorganic component such as other inorganic additives. Examples of the resin component include a rein component including both a thermoplastic resin and a thermosetting resin. Further, a thermoplastic resin or a thermosetting resin may be used alone.

(Thermoplastic Resin)

Examples of the thermoplastic resin include natural rubber, butyl rubber, isoprene rubber, chloroprene rubber, an ethylene-vinyl acetate copolymer, an ethylene-acrylic acid copolymer, an ethylene-acrylate copolymer, a polybutadiene resin, a polycarbonate resin, a thermoplastic polyimide resin, polyimide resins such as 6-nylon and 6,6-nylon, a phenoxy resin, an acrylic resin, saturated polyester resins such as PET and PBT, a polyamideimide resin, and a fluororesin. These thermoplastic resins can be used alone, or in combination of two or more thereof. Among these thermoplastic resins, an acrylic resin, which has less ionic impurities, has a high heat resistance and can ensure the reliability of a semiconductor element, is especially preferable.

The acrylic resin is not particularly limited, and examples thereof include polymers having as a component one or more of esters of acrylic acids or methacrylic acids which have a linear or branched alkyl group having 30 or less of carbon atoms, especially 4 to 18 carbon atoms. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl Group and an eicosyl group.

Other monomers for forming the polymer are not particularly limited, and examples thereof include carboxyl group-containing monomers such as acrylic acid, methacrylic acid, carboxyethyl acrylate, carboxypentyl acrylate, itaconic acid, maleic acid, fumaric acid and crotonic acid, acid anhydride monomers such as maleic anhydride and itaconic anhydride, hydroxyl group-containing monomers such as 2-hydroxyethyl (meth) acrylate, 2-hydroxypropyl (meth) acrylate, 4-hydroxybutyl (meth) acrylate, 6-hvdroxyhexyl (meth) acrylate, 8-hydroxyoctyl (meth)acrylate, 10-hydroxydecyl (meth) acrylate, 12-hydroxylauryl (meth)acrylate and (4-hydroxymethvicyclohexyl)-methyl acrylate, sulfonic acid group-containing monomers such as styrenesulfonic acid, allylsulfonic acid, 2-(meth)acrylamide-2-methvlpropanesulfonic acid, (meth) acrylamidepropanesulfonic acid, sulfopropyl (meth)acrylate and (meth) acryloyloxynaphthalenesulfonic acid, phosphoric acid group-containing monomers such as 2-hydroxyethylacryloyl phosphate, and cyano group-containing momomers such as acrylonitrile.

(Thermosetting Resin)

Examples of the thermosetting resin include a phenol resin, an amino resin, an unsaturated polyester resin, an epoxy resin, a polyurethane resin, a silicone resin and a thermosetting polyimide resin. These resins can be used alone, or in combination of two or more thereof. Particularly, an epoxy resin containing less ionic impurities that corrode a semiconductor element is preferable. curing agent for the epoxy resin is preferably a phenol resin.

The epoxy resin is not particularly limited as long as it is generally used as an adhesive composition, and for example a difunctional epoxy resin or a polyfunctional epoxy resin such as a bisphenol A type, a bisphenol F type, a bisphenol S type, a brominated bisphenol A type, a hydrogenated bisphenol A type, a bisphenol AF type, a biphenyl type, a naphthalene type, a fluorene type, a phenol novolak type, an orthocresol novolak type, a trishydroxyphenyl methane type or a tetraphenylol ethane type, or an epoxy resin such as a hydantoin type, a trisglycidyl isocvanurate type or a glycidyl amine type is used. They can be used alone, or in combination of two or more thereof. Among these epoxy resins, a novolak type epoxy resin, a biphenyl type epoxy resin, a trishydroxyphenyl methane type resin or a tetraphenylol ethane type epoxy resin is especially preferable. This is because the aforementioned resins have a high reactivity with a phenol resin as a curing agent, and are excellent in heat resistance and so on.

Further, the phenol resin acts as a curing agent for the epoxy resin, and examples thereof include novolak type phenol resins such as a phenol novolak resin, a phenol aralkyl resin, a cresol novolak resin, a tert-butylphenol novolak resin, and a nonylphenol novolak resin, resole type phenol resins, and polyoxystyrenes such as polyparaoxystyrene. They can be used alone, or in combination of two or more thereof. Among these phenol resins, a phenol novolak resin and a phenol aralkyl resin are especially preferable. This is because the connection reliability of a semiconductor device can be improved.

For example, the epoxy resin and the phenol resin are preferably blended at such a blending ratio that the equivalent of the hydroxyl group in the phenol resin per one equivalent of the epoxy group in the epoxy resin component is 0.5 to 2.0 equivalents. More preferable is 0.8 to 1.2 equivalents. That is, if the blending ratio of the resins falls out of the aforementioned range, the curing reaction does not proceed sufficiently, so that properties of the epoxy resin cured products are easily deteriorated.

In the present invention, an underfill material using an epoxy resin, a phenol resin and an acrylic resin is especially preferable. These resins have less ionic impurities and has a high heat resistance, and therefore can ensure the reliability of a semiconductor element. The blending ratio in this case is such that the mixed amount of the epoxy resin and the phenol resin is 50 to 500 parts by weight based on 100 parts by weight of the acrylic resin component.

(Latent Curing Accelerator)

The underfill material preferably contains a curing accelerator. Further, the underfill material preferably contains a latent curing accelerator. If the underfill material contains a latent curing accelerator as a curing accelerator, both the suppression of the increase of the viscosity after heating treatment and the curing reactivity can be achieved at a higher level. The latent curing accelerator exhibits a curing accelerating function under specific conditions (such as temperature).

Examples of the latent curing accelerator include a latent curing accelerator in which a normal curing accelerator is protected by a microcapsule, and a latent curing accelerator having a structure in which a curing accelerator and various types of compounds form a salt. In such a latent curing accelerator, for example, a curing accelerator is discharged from a microcapsule or a salt of the latent curing accelerator into the system when the temperature exceeds a specific temperature, and the curing accelerating function is exhibited. The latent curing accelerator can be appropriately selected and used so that the underfill material can exhibit the targeted viscosity change rate, melt viscosity, and reaction rate.

Examples of the latent curing accelerator include a reaction product of an amine compound and an epoxy compound (an amine-epoxy adduct-based latent curing agent) and a reaction product of an amine compound, an isocyanate compound, and a urea compound (a urea type adduct-based latent curing agent). Further, as the latent curing accelerator, it is possible to suitably use; salts of an amine compound and an organic acid that are in the form of solid particles insoluble in the underfill material and that dissociate at heat molding and exhibit a curing accelerating action; or a compound having an intra-molecular polarization formed by adding a compound having a π-bond to an amine compound or a phosphorus compound Specific examples of the latent curing accelerator include salts of a cycloamidine compound such as 1,8-diaza-bicyclo [5.4.0]undec-7-ene, 1,5-diaza-bicyclo[4.3.0]non-5-ene, and 6-dibutylamino-1,8-diaza-bicvclo [5.4.0]undec-7-ene with an organic acid; derivatives of a tertiary amine compound such as triethyleneamine, benzyldimethylamine, triethanolamine, dimethylamine ethanol, and tris(dimethylaminomethyl)phenol; derivatives of an imidazole compound such as 2-methylimidazole, 2-ethyl-4-methylimidazole, 2-phenylimidazole, 2-phenyl-4-methylimidazole, and 2-heptadecylimidazole; phosphorus compounds having an intra-molecular polarization formed by adding a compound having a π-bond such as maleic anhydride, a quinone compound such as 1,4-benzoquinone, 2,5-toluquinone, 1,4-naphtoquinone, 2,3-dimethylbenzoguinone, 2,6-dimethylbenzoguinone, 2,3-dimethoxy-5-methyl-1,4-benzoquinone, 2,3-dimethoxy-1,4-benzoguinone, or phenyl-1,4-benzoquinone, diazophenylmethane or a phenol resin to an organic phosphine compound such as tributyl phosphine, methyl diphenyl phosphine, triphenyl phosphine, diphenyl phosphine, or phenyl phosphine, and derivatives thereof; and phenylboron salts such as triphenylphosphine triphenylboron, tetraphenylphosphonium, tetraphenylborate, 2-ethyl-4-methylimidazole tetraphenylborate, and N-methylmorpholine tetraphenylborate, and derivatives thereof. These latent curing accelerator may be used either alone or in combination of two or more types. Among these, tetraphenylphosphonium tetraphenylborate is preferable.

The organic acid constituting the above-described salts is not particularly limited, and it can be appropriately selected from organic acids that are usually used. The organic acids constituting the salts can be roughly classified into phenol compounds, aliphatic carboxy compounds, and aromatic carboxy compounds.

The phenol compound is not particularly limited, and examples thereof include a novolak type phenol resin that can be obtained by condensing or co-condensing at least one type selected from phenols such as phenol, cresol, resorcin, catechol, bisphenol A, bisphenol F, phenylphenol, thiodiphenol and aminophenol and naphthols such as α-naphthol, β-naphthol, and dihydroxynaphthalene with a compound having an aldehyde group such as formaldehyde, benzaldehyde, or salicylaldehyde in the presence of an acid catalyst; a phenol aralkyl resin synthesized from one type selected from phenols and naphthols, and dimethoxyparaxylene or bis(methoxymethyl)biphenyl; an aralkyl type phenol resin such as a naphthol-aralkyl resin; a copolymerized phenol aralkyl resin in which a phenol novolak structure and a phenol aralkyl resin form a random block copolymer or they are alternately repeated; a paraxylylene and/or metaxylylene modified phenol resin; a melamine modified phenol resin; a terpene modified phenol resin; a dicyclopentadiene modified phenol resin; a cyclopentadiene modified phenol resin; and a polycyclic aromatic ring modified phenol resin.

Examples of the aliphatic carboxy compound include oxalic acid, lactic acid, tartaric acid, maleic acid, fumaric acid, malonic acid, succinic acid, malic acid, citric acid, aconitic acid, glutaric acid, adipic acid, formic acid, acetic acid, propionic acid, butyric acid, isolactic acid, valeric acid, isovaleric acid, caproic acid, enanthic acid, caprylic acid, pelargonic acid, capric acid, lauric acid, myristic acid, pentadecylic acid, palmitic acid, margaric acid, stearic acid, oleic acid, linoleic acid, linolenic acid, tuberculostearic acid, arachidic acid, arachidonic acid, eicosapentaenoic acid, behenic acid, docosahexaenoic acid, lignoceric acid, cerotic acid, montanoic acid, melissic acid, and L-ascorbic acid.

Examples of the aromatic carboxy compound include salicylic acid, gallic acid, benzoic acid, phthalic acid, cinnamic acid, mellitic acid, oxocarboxylic acid, and pyruvic acid. Examples of other organic acids include amino acid.

The content of the latent curing accelerator when the underfill material contains the latent curing accelerator is not particularly limited. The content of the latent curing accelerator is preferably 1 part by weight to 2 parts by weight or more, and more preferably 1.2 parts by weight to 1.8 parts by weight relative to 100 parts by weight of the acrylic resin. By making the content be within the above-described range, the curing reactivity can be improved further, and an excessive increase of the viscosity can be more effectively suppressed.

(Crosslinker)

When the underfill material 2 of this embodiment is preliminarily crosslinked to a degree, a polyfunctional compound that reacts with a functional group or the like at the end of the molecular chain of a polymer should be added as a crosslinker at the time of preparation. Consequently, adhesion properties under a high temperature can be improved to improve the heat resistance.

As the crosslinker, particularly polyisocyanate compounds such as tolylene diisocyanate, diphenylmethane diisocyanate, p-phenylene diisocyanate, 1,5-naphthalene diisocyanate and an adduct of a polyhydric alcohol and a diisocyanate are more preferable. Preferably, the added amount of the crosslinker is normally 0.05 to 7 parts by weight based on 100 parts by weight of the polymer. If the amount of crosslinker is more than 7 parts by weight, the adhering strength is reduced, thus being not preferable. On the other hand, if the amount of the crosslinker is less than 0.05 parts by weight, the cohesive strength becomes poor, thus being not preferable. Other polyfunctional compounds such as an epoxy resin may be included as necessary together with the above-mentioned polyisocyanate compound.

(Inorganic Filler)

An inorganic filler can be appropriately blended with the underfill material 2. Blending of the inorganic filler allows impartment of electrical conductivity, improvement of thermal conductivity, adjustment of a storage elastic modulus, and so on.

Examples of the inorganic filler include various inorganic powders made of ceramics such as silica, clay, plaster, calcium carbonate, barium sulfate, aluminum oxide, beryllium oxide, silicon carbide and silicon nitride, metals such as aluminum, copper, silver, gold, nickel, chromium, lead, tin, zinc, palladium and solder, or alloys, and carbon. They can be used alone, or in combination of two or more thereof. Above all, silica, particularly fused silica is suitably used.

The average particle diameter of the inorganic filler is not particularly limited, but is preferably in a range of 0.005 to 10 µm, more preferably in a range of 0.01 to 5 µm, further preferably in a range of 0.05 to 2.0 µm. If the average particle size of the inorganic filler is smaller than 0.005 µm, aggregation of the particles easily occurs, and it may be difficult to form the underfill material. In addition, it can cause the flexibility of the underfill material to decrease. Meanwhile, if the average particle size exceeds 10 µm, biting of the inorganic particles in the connection part of the underfill material and the adherend easily occurs. Therefore, the connection reliability of the semiconductor device may deteriorate. In addition, haze may increase due to coarsening of the particles. In the present invention, inorganic fillers having mutually different average particle diameters may be combined and used. The average particle diameter is a value determined by a photometric particle size analyzer (manufactured by HORIBA, Ltd.; Unit Name: LA-910).

The blending amount of the inorganic filler is preferably 10 to 400 parts by weight, more preferably 50 to 250 parts by weight, based on 100 parts by weight of the resin component. If the blending amount of the inorganic filler is less than 10 parts by weight, the storage elastic modulus may be reduced, thereby considerably deteriorating the stress reliability of a package. On the other hand, if the blending amount of the inorganic filler is more than 400 parts by weight, the fluidity of the underfill material 2 may be depressed, so that the underfill material may not sufficiently fill up raised and recessed portions of the substrate or semiconductor element, thus leading to generation of voids and cracks.

(Other Additives)

Besides the inorganic filler, other additives can be blended with the underfill material 2 as necessary. Examples of other additives include a flame retardant, a silane coupling agent and an ion trapping agent. Examples of the flame retardant include antimony trioxide, antimony pentaoxide and a brominated epoxy resin. They can be used alone, or in combination of two or more thereof. Examples of the silane coupling agent include β-(3,4-epoxycyclohexyl)ethyltrimethoxysilane, γ-glycidoxypropyitrimethoxysilane and γ-glycidoxypropylmethyldiethoxysilane. These compounds can be used alone, or in combination of two or more thereof. Examples of the ion trapping agent include a hydrotalcite and bismuth hydroxide. They can be used alone, or in combination of two or more thereof.

(Other Properties of Underfill Material)

Further, the water absorption rate of the underfill material 2 at a temperature of 23° C. and a humidity of 70% before heat curing is preferably 1% by weight or less, more preferably 0.5% by weight or less. The underfill material 2 has such a water absorption rate as described above, whereby absorption of moisture into the underfill material 2 can be suppressed, so that generation of voids during mounting of the semiconductor element 31 can be more efficiently suppressed. The lower limit of the water absorption rate is preferably as low as possible, and is preferably substantially 0% by weight, more preferably 0% by weight.

The thickness of the underfill material 2 (total thickness in the case of a multiple layer) is not particularly limited, but may be about 10 μm to 100 μm when considering the strength of the underfill material 2 and performance of filling a space between the semiconductor element 31 and the adherend 16. The thickness of the underfill material 2 may be appropriately set in consideration of the gap between the semiconductor element 31 and the adherend 16 and the height of the connection member.

The underfill material 2 of the laminated sheet 10 is preferably protected by a separator (not shown). The separator has a function as a protective material for protecting the underfill material 2 until practical use. The separator is peeled off when the semiconductor wafer 3 is attached onto the underfill material 2 of the laminated sheet. As the separator, polyethylene terephthalate (PET), polyethylene, polypropylene, or a plastic film or paper of which surface is coated with a release agent such as a fluorine-based release agent or a long-chain alkyl acrylate-based release agent can be used.

(Method for Producing a Laminated Sheet)

The laminated sheet 10 according to this embodiment can be prepared by, for example, preparing the dicing tape 1 and the underfill material 2 separately in advance, and finally bonding the former and the latter together. Specifically, the laminated sheet 10 can be prepared in accordance with the following procedure.

First, the base material 1a can be film formed by a previously known film formation method. Examples of the method for a film formation may include a calender film formation method, a casting method in an organic solvent, an inflation extrusion method in a closed system, a T-die extrusion method, a co-extrusion method and a dry lamination method.

Next, a pressure-sensitive adhesive composition for formation of a pressure-sensitive adhesive layer is prepared. Resins and additives as described in the context of the pressure-sensitive adhesive layer, and so on, are blended in the pressure-sensitive adhesive composition. The prepared pressure-sensitive adhesive composition is applied onto the base material 1a to form a coating film, and the coating film is then dried (crosslinked by heating as necessary) under predetermined conditions to form the pressure-sensitive adhesive layer 1b. The coating method is not particularly limited, and examples thereof include roll coating, screen coating and gravure coating. For drying conditions, for example, the drying temperature is in a range of 80 to 150° C., and the drying time is in a range of 0.5 to 5 minutes. The pressure-sensitive adhesive layer 1b may be formed by applying a pressure-sensitive adhesive composition onto a separator to form a coating film, followed by drying the coating film under the aforementioned conditions. Thereafter, the pressure-sensitive adhesive layer 1b is bonded onto the base material 1a together with the separator. In this way, the dicing tape 1 including the base material 1a and the pressure-sensitive adhesive layer 1b is prepared.

For example, the underfill material 2 is prepared in the following manner. First, an adhesive composition which is a material for forming the underfill material 2 is prepared. A thermoplastic component, an epoxy resin, various kinds of additives, and so on, are blended in the adhesive composition as described in the context of the underfill material.

Next, the prepared adhesive composition is applied onto a base material separator in a predetermined thickness to form a coating film, followed by drying the coating film under predetermined conditions to form an underfill material. The coating method is not particularly limited, and examples thereof include roll coating, screen coating and gravure coating. For drying conditions, for example, the drying temperature is in a range of 70 to 160° C., and the drying time is in a range of 1 to 5 minutes. The underfill material may be formed by applying a pressure-sensitive adhesive composition onto a separator to form a coating film, followed by drying the coating film under the aforementioned conditions. Thereafter, the underfill material is bonded onto the base material separator together with the separator.

Subsequently, the separator is peeled off from each of the dicing tape 1 and the underfill material 2, and the tape and the underfill material are bonded together such that the underfill material and the pressure-sensitive adhesive layer form a bonding surface. Bonding can be performed by, for example, heat pressure-bonding. At this time, the lamination temperature is not particularly limited and is, for example, preferably 30 to 100° C., more preferably 40 to 80° C. The linear pressure is not particularly limited and is, for example, preferably 0.98 to 196 N/cm, more preferably 9.8 to 98 Ni cm. Next, the base material separator on the underfill material is peeled off to obtain a laminated sheet according to this embodiment.

[Bonding Step]

In the bonding step, as shown in FIG. 1A, a semiconductor wafer 3, in which a circuit surface 3a having a connection member 4a and a circuit surface 3b having a backside electrode 4b are formed on both surfaces thereof, and the underfill material 2 of the laminated sheet are bonded together. Since the strength of a semiconductor wafer thinned to a predetermined thickness is low, the semiconductor wafer may be fixed to a support such as support glass with a temporary fixing material interposed therebetween for the purpose of reinforcement in some cases (not shown). In this case, a step of peeling off the support together with the temporary fixing material may be included after bonding the semiconductor wafer and the underfill material together. Of which circuit surfaces of the semiconductor wafer 3 is bonded to the underfill material 2 may be changed according to the intended structure of the semiconductor device.

(Semiconductor Wafer)

A plurality of connection members 4a and backside electrodes 4b are formed on the circuit surfaces 3a, 3b of the semiconductor wafer 3 (see FIG. 1A). Each material of the connection member and the backside electrode such as a bump or an electrically conductive material is not particularly limited, and examples thereof include solders (alloys)

such as a tin-lead-based metal material, a tin-silver-based metal material, a tin-silver-copper-based metal material, a tin-zinc-based metal material, a tin-zinc-bismuth-based metal material, a gold-based metal material and a copper-based metal material. The height of each of the connection member and the backside electrode is also determined according to the application, and is generally about 15 to 100 μm. Of course, the heights of individual connection members in the semiconductor wafer 3 may be the same or different.

A connection member 4a and a backside electrode 4b on both sides of a semiconductor wafer 3 may be electrically connected, or may not be electrically connected, with each other. Examples of the electrical connection of the connection member 4a and the backside electrode 4b include a connection through a via called a TSV type via.

In the method for producing a semiconductor device according to this embodiment, as the thickness of the underfill material, the height X (μm) of the connection member formed on the surface of the semiconductor wafer and the thickness Y (μm) of the underfill material preferably satisfies the following relationship:

$$0.5 \leq Y/X \leq 2$$

The height X (μm) of the connection member and the thickness Y (μm) of the cured film satisfy the above relationship, whereby a space between the semiconductor element and the adherend can be sufficiently filled, and excessive protrusion of the underfill material from the space can be prevented, so that contamination of the semiconductor element by the underfill material, and so on can be prevented. When the heights of the respective connection members are different, the height of the highest connection member is used as the reference.

(Bonding)

As shown in FIG. 1A, first a separator that is optionally provided on the under-fill 2 of the laminated sheet 10 is appropriately peeled off, the circuit surface 3a of the semiconductor wafer 3, on which the connection member 4a is formed, and the underfill material 2 are made to face to each other, and the underfill material 2 and the semiconductor wafer 3 are bonded together (mounting).

The method for bonding is not particularly limited, but is preferably a method pressure-bonding. Pressure-bonding is normally performed by pressing with a pressure of preferably 0.1 to 1 MPa, more preferably 0.3 to 0.7 MPa by known pressing means such as a pressure roller. At this time, pressure-bonding may be carried out while heating to about 40 to 100° C. It is also preferable to carry out pressure-bonding under a reduced pressure (1 to 1000 Pa) for improving adhesion.

[Dicing Step]

Figure 1B:
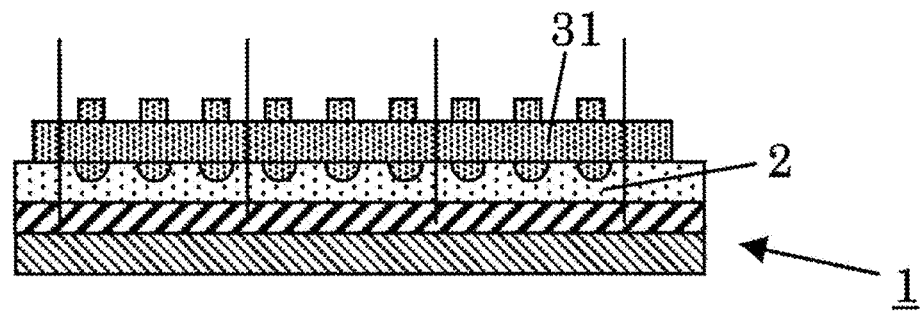
FIG. 1B is a sectional schematic view showing a step for producing a semiconductor device according to one embodiment of the present invention.

In a dicing step, as shown in FIG. 1B, the semiconductor wafer 3 and the underfill material 2 are diced based on a dicing position obtained by direct light or indirect light or infrared rays or the like to form the semiconductor element 31 with an underfill material. Through the dicing step, the semiconductor wafer 3 is cut to a predetermined size and thereby formed into individual pieces (small pieces) to produce a semiconductor chip (semiconductor element) 31. The semiconductor chip 31 thus obtained is integrated with the underfill material 2 cut in the same shape. Dicing is carried out from the circuit surface 3b side opposite to the circuit surface 3a of the semiconductor wafer 3, to which the underfill material 2 is bonded, in accordance with a usual method.

In this step, for example, a cutting method called full cut, in which cutting is made to a dicing tape 1 by a dicing blade, can be employed. The dicing device used in this step is not particularly limited, and one that is previously known can be used. The semiconductor wafer is adhesively fixed with excellent adhesion by the dicing tape 1, so that chipping and chip fly can be suppressed, and also damage of the semiconductor wafer can be suppressed. When the underfill material is formed from a resin composition containing an epoxy resin, occurrence of glue protrusion of the underfill material at the cut surface can be suppressed or prevented even though the underfill material is cut by dicing. As a result, reattachment of cut surfaces (blocking) can be suppressed or prevented, so that pickup described later can be further satisfactorily performed.

When expanding of the dicing tape is carried out subsequently to the dicing step, the expanding can be carried out using a previously known expanding device. The expanding device has a doughnut-like outer ring capable of pushing down the dicing tape via a dicing ring, and an inner ring having a diameter smaller than that of the outer ring and supporting the dicing tape. Owing to the expanding step, adjacent semiconductor chips can be prevented from contacting with each other and being damaged in a pickup step described later.

[Pickup Step]

Figure 1C:
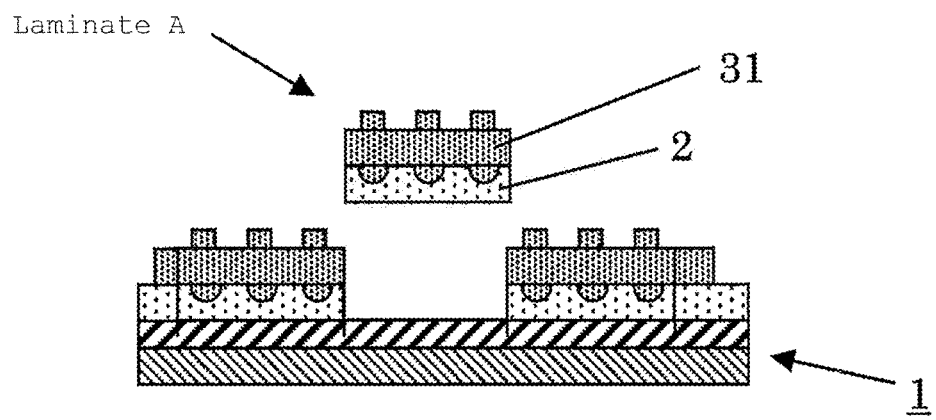
FIG. 1C is a sectional schematic view showing a step for producing a semiconductor device according to one embodiment of the present invention.

As shown in FIG. 1C, pickup of the semiconductor chip 31 with the underfill material 2 is carried out to peel off a laminate A of the semiconductor chip 31 and the underfill material 3 from the dicing tape 1 for collecting the semiconductor chip 31 adhesively fixed on the dicing tape 1.

The method for pickup is not particularly limited, and previously known various methods can be employed. Mention is made of, for example, a method in which individual semiconductor chips are pushed up by a needle from the base material side of the dicing tape, and the semiconductor chips, which have been pushed up, are collected by a pickup device. The semiconductor chip 31, which has been picked up, is integrated with the underfill material 2 bonded to the circuit surface 3a to form the laminate A.

Here, pickup is performed after irradiating the pressure-sensitive adhesive layer 1b with ultraviolet rays when the pressure-sensitive adhesive layer 1b is of an ultraviolet-ray curing-type. Consequently, adhesive power of the pressure-sensitive adhesive layer 1b to the underfill material 2 decreases, so that it becomes easy to peel off the semiconductor chip 31. As a result, pickup can be performed without damaging the semiconductor chip 31. Conditions such as an irradiation intensity and an irradiation time for irradiation of ultraviolet rays are not particularly limited, and may be appropriately set as necessary. As a light source used for irradiation of ultraviolet rays, for example, a low-pressure mercury lamp, a low-pressure high-power lamp, a medium-pressure mercury lamp, an electrodeless mercury lamp, a xenon flash lamp, an excimer lamp, an ultraviolet LED or the like can be used.

[Mounting Step]

Figure 1D:
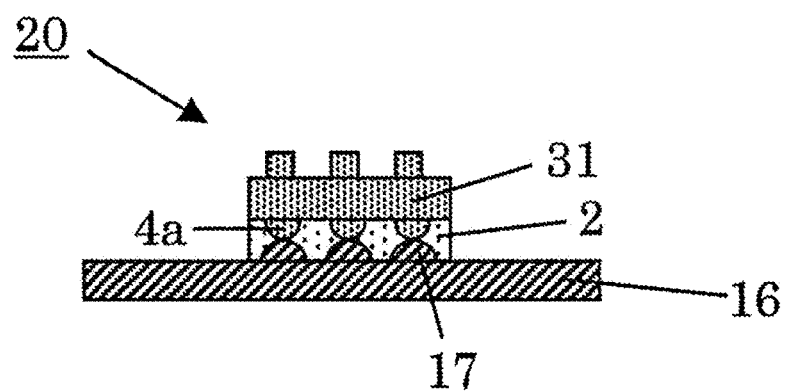
FIG. 1D is a sectional schematic view showing a step for producing a semiconductor device according to one embodiment of the present invention.

In the mounting step, a mounting position of a semiconductor element 31 is obtained in advance by direct light, indirect light, infrared radiation, etc., and the semiconductor element 31 is electrically connected to an adherend 16 through the connection member 4a according to the obtained mounting position while filling the space between the adherend 16 and the semiconductor element 31 with the underfill material 2 (refer to FIG. 1D). Specifically, the semiconductor chip 31 of the laminate A is fixed to the adherend 16 in accordance with a usual method in such a form that the circuit surface 3a of the semiconductor chip 31 is made to face to the adherend 16. For example, the bump (connection member) 4a formed on the semiconductor chip 31 is contacted with an electrically conductive material 17 (solder or the like) for bonding, which is attached to the connection pad of the adherend 16, and the electrically conductive material is melted while pressing, whereby electrical connection between the semiconductor chip 31 and the adherend 16 can be provided to fix the semiconductor chip 31 to the adherend 16. Since the underfill material 2 is bonded to the circuit surface 3a of the semiconductor chip 31, a space between the semiconductor chip 31 and the adherend 16 is filled with the underfill material 2 concurrently with electrically connecting of the semiconductor chip 31 and the adherend 16.

Figure 1E:
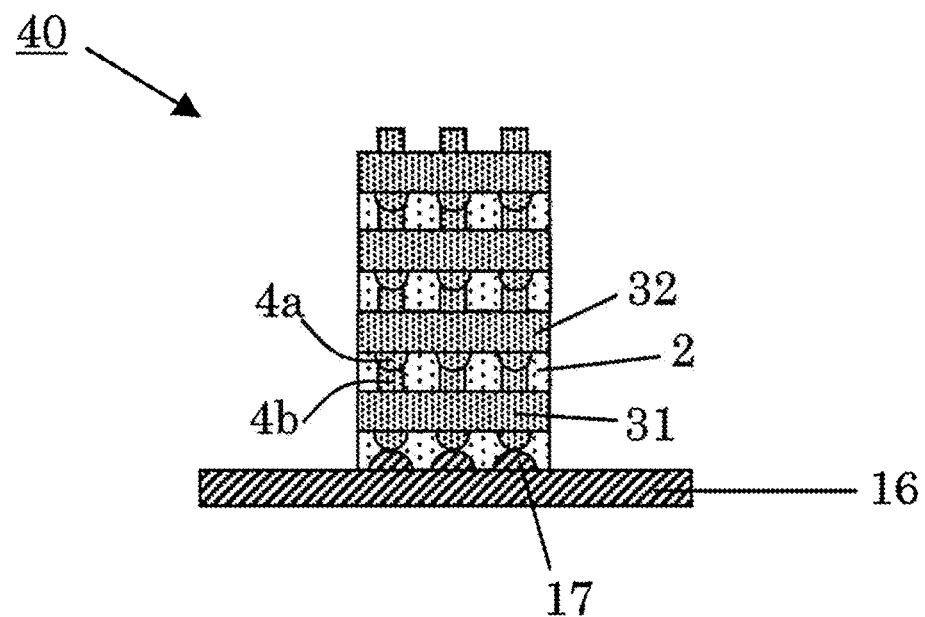
FIG. 1E is a sectional schematic view showing a step for producing a semiconductor device according to one embodiment of the present invention.

As shown in FIG. 1E, a procedure of fixing a semiconductor element 32 of a different laminate on the mounted semiconductor element 31 should be repeated a targeted number of tiers when the semiconductor elements are to be laminated in tiers. The backside electrode 4b provided on a circuit surface 3b that is the backside of the semiconductor element 31 and the connection member 4a of the semiconductor element 32 may be bonded by melting. The bonding process of the semiconductor element 31 on the lower tier and the semiconductor element 32 on the upper tier may be performed tier by tier or the bonding treatment may be performed all at once after the semiconductor elements of a predetermined number of tiers are temporarily fixed. The latter procedure is preferable in terms of efficiency because the heating treatment can be completed all at once.

Generally, as the conditions of temporary fixing in the mounting step, the temperature is 100° C. to 200° C. and the applied pressure is 0.5 N to 100 N. As the bonding conditions in the mounting step, the temperature is 150° C. to 300° C. and the applied pressure is 1 N to 200 N. The bonding treatment for each tier in the mounting step may be divided into a plurality of time intervals. For example, it is possible to a procedure in which a treatment is performed at 150° C. and 20 N for 10 seconds and then at 260° C. and 30 N for 10 seconds. The bonding treatment may be divided into a plurality of time intervals to effectively remove the resin between the connection member and the pad and between the connection member and the backside electrode, and obtain a better metal-to-metal bonding.

As the adherend 16, a semiconductor wafer, a lead frame, various kinds of substrates such as and a circuit substrate (such as a wiring circuit substrate), and other semiconductor elements can be used. Examples of the material of the substrate include, but are not limited to, a ceramic substrate and a plastic substrate. Examples of the plastic substrate include an epoxy substrate, a bismaleimide triazine substrate, a polyimide substrate and a glass epoxy substrate.

In the mounting step, one of the connection member, the backside electrode, and the conductive material or combination of these is melted to connect a bump 4a on a connection member formation surface 3a of the semiconductor chip 31 with a conductive material 17 on the surface of the adherend 16, and the backside electrode 4b of the semiconductor chip 31 is bonded to the connection member 4a of the semiconductor chip 32. However, the temperature at melting of the bump 4a, the backside electrode 4b and the conductive material 17 is normally about 260° C. (for example, 250° C. to 300° C.). The laminated sheet according to the present embodiment can have sufficient heat resistance so that the laminated sheet can withstand high temperature in the mounting step by formation of the underfill material 2 with an epoxy resin, etc.

[Underfill Material Curing Step]

After the semiconductor element 31 is electrically connected to the adherend 16, and the semiconductor elements laminated in tiers are electrically connected to each other as necessary, the underfill material 2 is cured by heating. Accordingly, the surface of the semiconductor element 31 can be protected, and the connection reliability can be ensured between the semiconductor element 31 and the adherend 16 and between the semiconductor elements. The heating temperature for curing the underfill material is not particularly limited, and it may be about 150° C. to 250° C. When the underfill material is cured by the heating treatment in the mounting step, this step can be omitted. A semiconductor device 20 having one tier of the semiconductor element 31 and a semiconductor device 40 in which the semiconductor elements are laminated in tiers can be obtained through the above-described steps.

[Sealing Step]

Next, a sealing step may be carried out for protecting the whole of a semiconductor device 20 or 40 including the mounted semiconductor chip. The sealing step is carried out using a sealing resin. The sealing conditions at this time are not particularly limited, and normally the sealing resin is heat-cured by heating at 175° C. for 60 seconds to 90 seconds, but the present invention is not limited thereto and, for example, the sealing resin may be cured at 165° C. to 185° C. for several minutes.

The sealing resin is not particularly limited as long as it is a resin having an insulating property (insulating resin), and can be selected from sealing materials such as known sealing resins and used, but an insulating resin having elasticity is more preferable. Examples of the sealing resin include a resin composition containing an epoxy resin. Examples of the epoxy resin include the epoxy resins described previously as an example. The sealing resin by the resin composition containing an epoxy resin may contain, as a resin component, a thermosetting resin (phenol resin, etc.), a thermoplastic resin and so on in addition to an epoxy resin. The phenol resin can also be used as a curing agent for the epoxy resin, and examples of such a phenol resin include the phenol resins described previously as an example.

[Semiconductor Device]

A semiconductor device obtained by using the laminated sheet is described below with reference to the drawings (refer to FIGS. 1D and 1E). In the semiconductor device 40 according to the present embodiment, the semiconductor element 31 is electrically connected to the adherend 16 through the bump (connection member) 4a formed on the semiconductor element 31 and the conductive material 17 provided on the adherend 16. Further, the backside electrode 4b of the semiconductor element 31 and the connection member 4a of the semiconductor element 32 are bonded together to establish the electrical connection between the semiconductor elements 31 and 32. The underfill material 2 is provided between the semiconductor element 31 and the adherend 16 and between the semiconductor elements 31 and 32 so that the spaces can be filled with the underfill material 2. Because the semiconductor device 40 can be obtained by the above-described manufacturing method adopting the predetermined underfill material 2 and the positioning by light irradiation, good electrical connection can be achieved between the semiconductor element 31 and the adherend 16 and between the semiconductor elements 31 and 32. Therefore, each of the following processes can be achieved at a sufficient level: the surface protection of the semiconductor element, the filling of the spaces between the semiconductor element 31 and the adherend 16 and between the semiconductor elements 31 and 32, and the electrical connection between the semiconductor element 31 and the adherend 16 and between the semiconductor elements 31 and 32. Thus, high reliability of the semiconductor device 40 can be exhibited.

<Second Embodiment>

In contrast to the first embodiment in which a semiconductor wafer having a circuit on both surfaces is used, a semiconductor wafer having a circuit on one surface is used in the present embodiment to manufacture a semiconductor device. When the semiconductor wafer used in the present embodiment does not have the targeted thickness, a grinding step of grinding the backside of the semiconductor wafer on the opposite side of the circuit surface is performed. Therefore, grinding of the backside of the semiconductor wafer is performed by using the laminated sheet including the underfill material laminated on a tape for grinding the backside, and then dicing on the dicing tape and pickup of the semiconductor element are performed to finally mount the semiconductor element on the adherend. The base material and the pressure-sensitive adhesive layer of the tape for grinding the backside and the underfill material used can be the same as those in the first embodiment.

As typical steps, a method of the present embodiment includes a preparation step of preparing a laminated sheet including a tape for grinding the backside and an underfill material laminated on the tape for grinding the backside, a bonding step of bonding a circuit surface of a semiconductor wafer on which connection members are formed to an underfill material of the laminated sheet, a grinding step of grinding the backside of the semiconductor wafer, a fixing step of peeling the semiconductor wafer together with the underfill material from the tape for grinding the backside and bonding the semiconductor wafer to a dicing tape, a dicing position determining step of determining a dicing position in the semiconductor wafer, a dicing step of dicing the semiconductor wafer to form a semiconductor element with the underfill material, a pickup step of peeling the semiconductor element with the underfill material from the dicing tape, a position alignment step of aligning the relative position between the semiconductor element and the adherend to their planned connection position, and a connection step of electrically connecting the semiconductor element with the adherend through the connection members while filling the space between the adherend and the semiconductor element with the underfill material. The dicing tape of the first embodiment may be used or a known commercial product, etc. may be used as the dicing tape of the second embodiment. In addition, the known conditions or the same conditions as those in the first embodiment can be suitably adopted for the conditions of each step in the second embodiment.

<Third Embodiment>

A dicing tape is used in the first embodiment as the constituting member of the laminated sheet. However, a base material is used alone in the present embodiment without providing a pressure-sensitive adhesive layer of the dicing tape. Therefore, the laminated sheet of the present embodiment has an underfill material laminated on the base material. In the present embodiment, ultraviolet radiation is not performed before the pickup step because the pressure-sensitive adhesive layer is omitted. Other than these points, a predetermined semiconductor device can be manufactured through the same steps as those in the first embodiment.

<Other Embodiments>

In the first to third embodiments, dicing using a dicing blade is adopted in the dicing step. However, the so-called stealth dicing may be alternatively adopted, in which a modified part is formed inside of the semiconductor wafer by laser irradiation, and the semiconductor wafer is divided along this modified part to form individual pieces.

EXAMPLES

Preferred Examples of the present invention will be illustratively described in detail below. However, for the materials, the blending amounts, and so on described in Examples, the scope of the present invention is not intended to be limited thereto unless definitely specified. The part (s) means "part (s) by weight".

Examples 1 to 5 and Comparative Examples 1 to 4

(Preparation of Underfill Material)

The following components were dissolved in methyl ethyl ketone at a ratio shown in Table 1 to prepare an adhesive composition solution having a solid concentration of 25.4 to 60.6% by weight .

Acrylic resin: acrylic acid ester-based polymer having an ethyl acrylate-methyl methacrylate as a main component (trade name "Paraclone W-197CM" manufactured by Negami Chemical Industrial Co., Ltd.)

Epoxy resin 1: trade name "Epicoat 1004" manufactured by JER Corporation

Epoxy resin 2: trade name "Epicoat 828" manufactured by JER Corporation

Phenol resin: trade name "Mirex XLC-4L" manufactured by Mitsui Chemicals, Incorporated Inorganic filler: spherical silica (trade name "SO-25R" manufactured by Admatechs)

Latent curing accelerator: phosphorus-based curing accelerator (trade name "TPP-K" manufactured by Hokko Chemical Industry)

Flux: o-anisic acid (trade name "Orthoanisic Acid" manufactured by Tokyo Chemical Industry Co., Ltd.)

The adhesive composition solution was applied onto a release-treated film made of a silicone release-treated polyethylene terephthalate film having a thickness of 50 μm as a release liner (separator), and thereafter dried at 130° C. for 2 minutes to thereby prepare an underfill material having a thickness of 17 μm.

<Measurement of Melt Viscosity>

The measurement was performed on a sample of the produced underfill material that did not go through a heating treatment by a parallel plate method using a rheometer ("RS-1" manufactured by Haake Technik GmbH). More specifically, the temperature was increased from 80° C. under the conditions of a gap of 100 μm, a diameter of the rotating plate of 20 mm, a rotation speed of 5 $s^{-1}$, and a temperature rise rate of 10° C./min, and the measurement was performed until the temperature reached a temperature at which the viscosity increased due to the curing reaction of the underfill material and the rotating plate was no longer rotatable in the end (200° C. or more in all of the examples and comparative examples). Then, the melt viscosity at 150° C. was read. The results are shown in Table 1.

<Measurement of Viscosity Change Rate>

The melt viscosity at 150° C. in the measurement of the melt viscosity was represented by $\eta 1$. The same procedure was also performed on a sample that was heat-treated at 130° C. for 1 hour, and the melt viscosity $\eta 2$ at 150° C. then was read. Based on the following formula, the viscosity change rate before and after heating treatment at 130° C. for 1 hour was calculated. The results are shown in Table 1.

Viscosity change rate (%)=$(\eta 2/\eta 1) \times 100\%$

<Measurement of Reaction Rate in DSC Measurement>

The total calorific value Qt was calculated when the temperature of the underfill material before heating treatment was increased from −50° C. to 300° C. at 10° C./min using a differential scanning calorimeter ("Q2000" manufacture by TA Instruments, Inc.). Separately, a heating treatment at 175° C. for 2 hours was performed on the underfill material before heating treatment, and the total calorific value Qh was measured when the temperature of the sample after the heating treatment was increased from −50° C. to 300° C. at 10° C./rain. Based on the following formula, the reaction rate after the heating treatment was performed at 175° C. for 2 hours was calculated. The results are shown in Table 1.

Reaction rate (%)={(Qt−Qh)/Qt}×100%

<Evaluation of Bump Bonding Property>

A semiconductor chip having bumps on one surface and pads on the other surface was prepared, and each of the underfill material produced in the examples and the comparative examples was bonded at 80° C. to the surface of the semiconductor chip on which bumps are formed. A semiconductor chip having the following specifications was used.

(Semiconductor Chip)
Size: 5-mm square
Thickness: 0.05 mm (50 μm)
Material of bump: Copper pillar+Sn—Ag
Bump size: Height 15 μm, Diameter 20 μm
Bump pitch: 40 μm, full array
Pad: Ni—Au pad
Height of pad: 2 μm Next, a laminating step was performed under the following thermocompression bonding conditions, and the semiconductor chip was thermocompression-bonded to a copper plate while the bump formation surface of the semiconductor chip faced the copper plate having a thickness of 200 μm to temporarily fix the semiconductor chip. Thereafter, the semiconductor chip with the underfill material of the second tier was temporarily fixed on the semiconductor chip on the first tier that was temporarily fixed on the copper plate under the same thermocompression bonding conditions. This procedure was repeated to laminate four tiers of semiconductor chips in total.

(Thermocompression Bonding Conditions)
Flip-chip bonder: Trade name "FC-3000W" manufactured by Torav Engineering Co., Ltd.
Heating temperature: 150° C.
Load: 20 N
Holding time: 2 seconds Finally, four tiers of semiconductor chips were bonded at once under the following bonding conditions to produce a chip bonded body.

(Bonding Conditions)
Flip-chip bonder: Trade name "FC-3000W" manufactured by Toray Engineering Co., Ltd.
Heating temperature: 260° C.
Load: 30 N
Holding time: 10 seconds The evaluation of the bump bonding property was performed by the following procedure. The heating treatment at 175° C. for 2 hours was performed on the chip bonded body to cure the underfill material. Then, the cutting treatment was performed on the side of the chip bonded body to expose bump bonding interfaces from the first to fourth tiers. The cross section of the exposed bonding interfaces was ground, and observed using an optical microscope (1,000-fold). A case in which the bump and the pad were bonded together without any problem was evaluated as "○," and a case in which cracks were generated in the bump or a case in which the bump was not bonded to the pad was evaluated as "×." The results are shown in Table 1.

<Evaluation of Hygroscopic Solder Reflow>

The heating treatment at 175° C. for 2 hours was performed on the obtained chip bonded body to cure the underfill material. After the chip bonded body having been subjected to heating treatment was left in an atmosphere of 85° C. and 85% Rh for 168 hours, a reflow test was performed. The reflow test was performed under the conditions in accordance with the conditions stipulated in JEDEC (J-STD-020C). After reflow, the chip bonded body was cut so that the cross section includes a bonded portion. The cross section was observed with an optical microscope (1,000-fold). A case in which the bump and the pad were bonded together without any problem was evaluated as "○," and a case in which cracks were generated in the bump or a case in which the bump was not bonded to the pad was evaluated as "×." The results are shown in Table 1.

TABLE 1

|  | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|
| Acrylic Resin | 100 | 100 | 100 | 100 | 100 | 100 | 100 | 100 | 100 |
| Epoxy Resin 1 | 262.5 | 150 | 150 | 150 | 112.5 | 150 | 150 | 150 | 86.25 |
| Epoxy Resin 2 | 87.5 | 50 | 50 | 50 | 37.5 | 50 | 50 | 50 | 28.75 |
| Phenol Resin | 350 | 200 | 200 | 200 | 150 | 200 | 200 | 200 | 115 |
| Inorganic Filler | 650 | 650 | 650 | 650 | 650 | 650 | 650 | 650 | 650 |
| Latent Curing Accelerator | 1.3 | 1.3 | 2 | 2 | 2 | 3 | 0.125 | 2 | 1.3 |
| Flux | 30 | 30 | 30 | 60 | 30 | 30 | 30 | 90 | 30 |
| Melt Viscosity [Pa · s] at 150° C. | 68 | 520 | 572 | 312 | 2765 | 599 | 475 | 375 | 3276 |
| Viscosity change rate [%] before and after heating at 130° C. for 1 h | 389 | 210 | 352 | 485 | 485 | 515 | 134 | 672 | 309 |
| DSC Reaction Rate [%] (after heating at 175° C. for 2 h) | 96 | 96 | 94 | 95 | 95 | 94 | 72 | 91 | 91 |
| Evaluation of Bonding Property after four-Tier Lamination | ○ | ○ | ○ | ○ | ○ | x | ○ | x | x |
| Hygroscopic Solder Reflow Property | ○ | ○ | ○ | ○ | ○ | — | x | — | — |

"—" in the results of the evaluation of the hygroscopic solder reflow property shows a case in which the reflow test after bump bonding was not performed because a problem occurred during bump bonding.

As is clear from Table 1, the bump bonding property was satisfactory in all the examples, and good electrical connection was obtained even when the underfill material was loaded with thermal history. The moisture and heat resistance reliability of the underfill material in the examples was also satisfactory. Meanwhile, the bump bonding property was poor in Comparative Examples 1, 3, and 4. This is probably caused by the generation of cracks due to a stress generated in the bump or that the bump did not reach the pad, since the viscosity in chip lamination was too high or the viscosity change rate was too high. In Comparative Example 2, the bump bonding property was satisfactory. However, the reliability after the moisture reflow test was poor. This is probably caused by the underfill material not having been cured sufficiently. Because the problems occured during bump bonding as described above in Comparative Examples 1, 3, and 4, the moisture reflow test itself was not performed following the bump bonding.

DESCRIPTION OF REFERENCE CHARACTERS

1 Dicing Tape
1a Base material
1b Pressure-Sensitive Adhesive Layer
2 Underfill Material
3 Semiconductor Wafer
10 Laminated Sheet
Adherend
20, 40 Semiconductor Device
31 Semiconductor Chip (Semiconductor Element)

The invention claimed is:

1. An underfill material, wherein
a melt viscosity at 150° C. before heating treatment is 50 Pa·s or more and 3,000 Pa·s or less,
a viscosity change rate represented by $(\eta 2/\eta 1) \times 100\%$ is 500% or less, where $\eta 1$ is a melt viscosity at 150° C. before heating treatment and $\eta 2$ is a melt viscosity at 150° C. after heating treatment at 130° C. for 1 hour, and
a reaction rate represented by $\{(Qt-Qh)/Qt\} \times 100\%$ is 90% or more, where Qt is a total calorific value in a process of temperature rise from −50° C. to 300° C. and Qh is a total calorific value in a process of temperature rise from −50° C. to 300° C. after heating at 175° C. for 2 hours in a DSC measurement.

2. The underfill material according to claim 1, comprising a latent curing accelerator.

3. The underfill material according to claim 2, comprising an acrylic resin, and 1 part by weight to 2 parts by weight of the latent curing accelerator relative to 100 parts by weight of the acrylic resin.

4. A laminated sheet, comprising
a pressure-sensitive adhesive tape having a base material and a pressure-sensitive adhesive layer provided on the base material, and
the underfill material according to claim 1 laminated on the pressure-sensitive adhesive layer.

5. A method for manufacturing a semiconductor device comprising an adherend, a semiconductor element electrically connected to the adherend, and an underfill material filling a space between the adherend and the semiconductor element, the method comprising:
a step of preparing a semiconductor element with an underfill material in which the underfill material according to claim 1 is bonded to the semiconductor element, and
a connecting step of electrically connecting the semiconductor element with the adherend while filling the space between the adherend and the semiconductor element with the underfill material.

* * * * *